United States Patent [19]

Arai et al.

[11] Patent Number: 5,145,800
[45] Date of Patent: Sep. 8, 1992

[54] METHOD OF WIRING FOR POWER SUPPLY TO LARGE-SCALE INTEGRATED CIRCUIT

[75] Inventors: Kiyokazu Arai, Hadano; Masatoshi Kawashima, Tokyo; Akira Yamagiwa; Toshihiro Okabe, both of Hadano, all of Japan

[73] Assignee: Hitachi, Ltd., Tokyo, Japan

[21] Appl. No.: 731,616

[22] Filed: Jul. 17, 1991

[30] Foreign Application Priority Data

Jul. 17, 1990 [JP] Japan .................. 2-189237

[51] Int. Cl.$^5$ ............................. H01L 21/70
[52] U.S. Cl. ............................ 437/51; 437/48; 357/45
[58] Field of Search .......... 437/48, 51, 52; 357/45; 307/465.1; 364/490, 491

[56] References Cited

U.S. PATENT DOCUMENTS 4,989,062  1/1991  Takahashi et al. ............... 357/45

FOREIGN PATENT DOCUMENTS 0134921   6/1987  Japan ................................ 357/45
0300530  12/1988  Japan ................................ 357/45
0204444   8/1989  Japan ................................ 357/45
0208841   8/1989  Japan ................................ 357/45

Primary Examiner—Tom Thomas
Attorney, Agent, or Firm—Antonelli, Terry, Stout & Kraus

[57] ABSTRACT

A method for wiring a power supply for a large-scale integrated circuit. The power supply wires define a power supply grid surrounding lattice openings with fixed longitudinal and transverse lattice dimensions. The wire width is determined based on the integrated circuit chip size, the number of function circuits to be on the integrated circuit, the electrical power requirements of the function circuits, and the fixed longitudinal and transverse lattice dimensions. Longitudinal and transverse locations of the power supply wires chips are determined based on the determined wire width and the fixed longitudinal and transverse dimensions of the lattice openings. Alternatively, the wire width may be fixed and the dimensions of the lattice openings determined based on the integrated circuit chip size, the number of function circuits, the electrical power requirements of the function circuits and that wire width. When the electrical power requirement of a function circuit is significantly larger than that of another function circuit, the wire width may be increased in the vicinity of the one function circuit. When the function circuits include a large-scale function block, a wire width around a region of the integrated circuit chip in which the large-scale block is to be disposed may be selected which results in a wire area equal to the wire area of the power supply wire that would occupy the particular region for usual function circuits.

8 Claims, 6 Drawing Sheets

METHOD OF WIRING FOR POWER SUPPLY TO LARGE-SCALE INTEGRATED CIRCUIT

BACKGROUND OF THE INVENTION

The present invention relates to a method of wiring a power supply to large-scale integrated circuit and, more particularly, to a method of wiring a power supply for large-scale integrated circuit adapted so as to effectively design the wiring for the power supply for large-scale integration as a part of large-scale integration family, including a large-scale integrated circuit such as a gate array LSI, whose chip size (exterior dimension) varies with the scale or size of a logic circuit or a memory circuit to be formed in the large-scale integrated circuit.

Heretofore, in the technique of designing the wiring for a power supply for a large-scale integrated circuit such as designing the wiring for power supply for a gate array LSI of a fixed channel type, basic data such as width of the wire, its location, the number of wires, etc., is predetermined for each chip size, and the design for the wiring is performed by using such basic data. Hence, the wiring is predetermined in a fixed manner regardless of the scale or size of the power supply required for the effective operation of a function circuit, such as a logic circuit, a memory circuit, etc.

The technique of designing the wiring for a power supply so as to vary the width of the wire with consumption of electric power is disclosed, for example, in Japanese Patent Laid-open Publication (kokai) No. 173,855/1985. This technique involves constructing an integrated circuit so as to vary its wire width in approximate proportion with the magnitude of electrical power consumed by the logic and memory circuits.

It is to be noted that, for a LSI composed of logic and memory CMOS (Complementary Metal Oxide Semiconductor) circuit serving as a function device constituting the integrated circuit, its operative frequency serves as a parameter indicative of the magnitude of electric power consumed. Hence, in this case, the integrated circuit is so designed as to vary the width of wire with its operative frequency.

It should be noted, however, that the consumption of electric power by the large-scale integrated circuit varies with the scale or size of the function circuits such as logic circuits or memory circuits to be formed in the large-scale integrated circuit and with the operative frequency, so that the technique of wiring for the power supply to the integrated circuit as described hereinabove requires the wiring to change in accordance with the consumption of electrical power. This means that, in preparing CMOS gate array LSIs as a large-scale integration family, the technique of designing the specification for optimum wiring with its use taken into account becomes complex because the chip size should be changed in accordance with the size or scale of integration.

Further, the prior art method for wiring a power supply as described hereinabove requires the wiring to be performed with a surplus of electrical characteristics required for wiring for the power supply because nothing about the scale of the logic circuits and the memory circuits during the effective operation is taken into account in setting the wiring for the power supply to the gate array LSIs. Hence, a surplus of wire is generally provided.

When the wiring is performed through automatic designing by computer processing, the operation of the logic circuit at each location should be simulated in order to set the width of the wire on the basis of the operative frequency of the logic circuit. Consequently the conversion an algorithm for automatic designing becomes difficult.

SUMMARY OF THE INVENTION

Therefore, the object of the present invention is to provide a method of wiring a power supply for a large-scale integrated circuit adapted so as to effectively design the wiring for the power supply for large-scale integration as a part of a large-scale integration family in which the chip size varies with the scale or size of logic circuits or memory circuits to be formed in the large-scale integration.

In order to achieve the aforesaid object, the present invention consists of a method of wiring a power supply for a large-scale integrated circuit of a large-scale integration family having a group of function circuit to be formed as elements of the large-scale integrated circuit signal wiring connecting groups of function circuits to each other, and wire for a power supply, and having a structure in which the chip size varies with the scale or size of integration of the group of function circuits to be formed, which comprises, at an upper portion of a region of an integrated circuit chip on which the group of function circuit is formed, setting the longitudinally extending wire so as to be spaced longitudinally a particular longitudinal distance from the chip upper end to the chip lower end, setting the transversely extending wire so as to be spaced transversely a particular transverse distance from the chip left end to the chip right end, and setting the width of the wire so as to vary with the chip size, the effective number of function circuits used and consumption of electric power of the function circuit, while fixing the transverse lattice distance between a pair of the longitudinally extending wires and a longitudinal lattice distance between a pair of the transversely extending wires.

On the contrary, it is also possible to vary the transverse distance between a pair of the longitudinally extending wires and the longitudinal distance between a pair of the transversely extending wire with the chip size, the effective number of function circuit used and the magnitude of the electric power consumed by the function circuits, as parameters, while fixing the width of the longitudinally extending wire and the transversely extending wire.

The large-scale integrated circuit of the large-scale integrated circuit family referred to herein has the function circuit designed in advance to be formed therein as an element of the large-scale integration, which has a group of function circuits to be formed, the signal wires connecting the groups of function circuits to each other, and the wire connected to the power supply and which is of a structure in which its chip size varies with the scale or size of integration of the group of the function circuit to be formed. In wiring for a power supply for the large-scale integrated circuit of the large-scale integrated circuit family in the manner as described hereinabove, the longitudinally extending wire is set to be spaced longitudinally in a particular longitudinal distance from the chip top end to its bottom end and the transversely extending wire is set to be spaced transversely in a particular transverse distance from its right end to its left end, thereby forming a lattice-shaped structure of wire, at an upper portion of the region of the integrated circuit of an integrated circuit chip in which the groups of function circuits are formed. Then, the widths of the longitudinally extending wire and the transversely extending wire, respectively, are varied with the chip size of the integrated circuit chip in which the group of the function circuit is formed, the effective number of function circuits of the group, and the magnitude of electric power consumed by the function circuits of the group as parameters, while fixing the lattice distances between the longitudinally extending wires and between the transversely extending wires. The wire width is determined in accordance with the predetermined function formula (designing standard formula) by using the aforesaid parameters as variables.

Alternatively, the method for wiring involves varying the lattice distances between the longitudinally extending wires and between the transversely extending wires with the parameters as described hereinabove while fixing the width of the longitudinally extending wire and the transversely extending wire. In this case, too, the lattice distances are determined by setting the functions in advance and then computing the functions by using the parameters as variables. Further, the number of wires per unit area may be altered.

Specifically, the function circuit group includes logic and memory circuits Further, the chip size of the large-scale integrated circuit may vary with the scale or size of the function circuit group to be formed in the integrated circuit chip, so that the width of the longitudinally extending wire and the transversely extending wire or the lattice distances between the longitudinally extending wires and between the transversely extending wires are varied by using (1) the chip size, (2) the effective number of circuits of the function circuit used, and (3) the frequency of the operation of the logic circuit as parameters. The wiring for a power supply for the integrated circuit is performed by setting the optimum wire width in order to satisfy the electrical and physical characteristics of the wiring. The wire width and the lattice distance between the wires can be computed by the formula according to the predetermined designing standard, and the automatic designing of the wiring for the power supply can be performed by computer processing.

This technique can make the processing for determining the wiring specification algorithmic in processing the wiring design for mounting the function circuit group to the large-scale integration by computer. In other words, the design processing for setting the wiring for the power supply of the large-scale integrated chip can be executed by designating the per se known chip size (Z), per se known or unknown lattice distance (M) between the longitudinally extending wires, lattice distance (N) between the transversely extending wires, wires width (a) of the longitudinally extending wire, wire width (b) of the transversely extending wire, effective number of circuits of the function circuit (G), operative frequency of the logic circuit (a parameter of the electrical power consumed) (F), etc., as running parameters for the computer.

For instance, the width (a, b) of the wire can be computed by the predetermined formula: $a, b = f_1(L, M, N, G, F)$ or through a figure table by determining the lattice distances (M, N) for each chip size (L) and then designating the operative frequency (F) of the logic operation as a running parameter for computer.

Alternatively, the lattice distances (M, N) between the longitudinally extending wires and between the transversely extending wires can be computed by the predetermined formula: $M, N = f_2(L, a, b, G, F)$ or through a figure table by determining the width (a, b) of the wires for each the chip size (L) and then designating the operative frequency (F) of the logic operation as a running parameter for computer.

The wiring specification is then determined on the basis of the given wire width a and b or the given lattice distances M and N, and the mounting design is then performed to mount the large-scale integrated chip on the basis of the resultant wiring specification, thereby enabling efficient wiring by computer processing.

DESCRIPTION OF THE PREFERRED EMBODIMENTS

Figure 1:
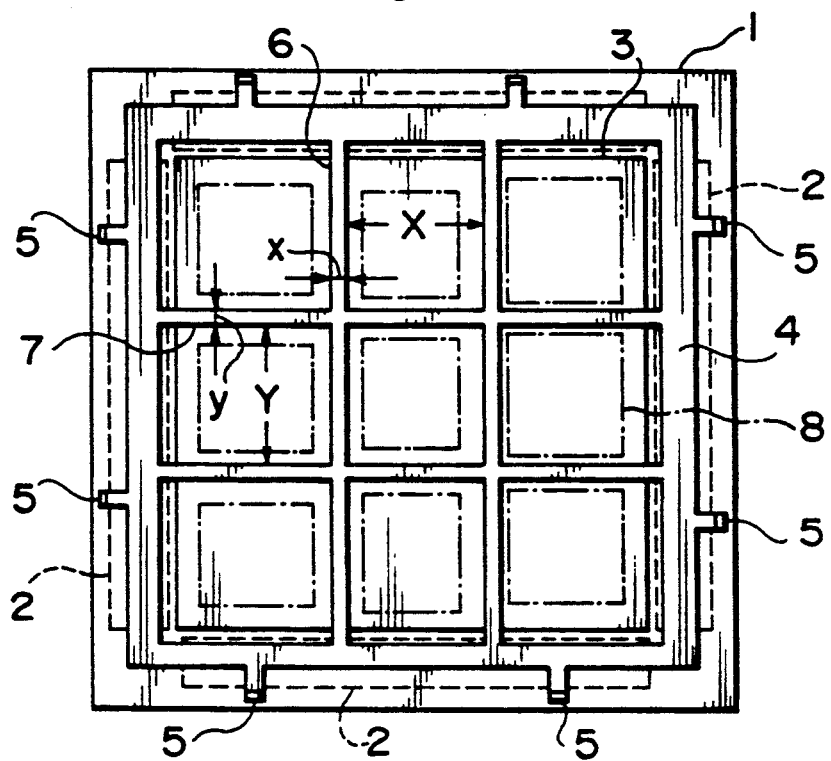
FIG. 1 is a plan view showing an example of wiring for a power supply of a large-scale integrated circuit according to an embodiment of the present invention.
Figure 2:
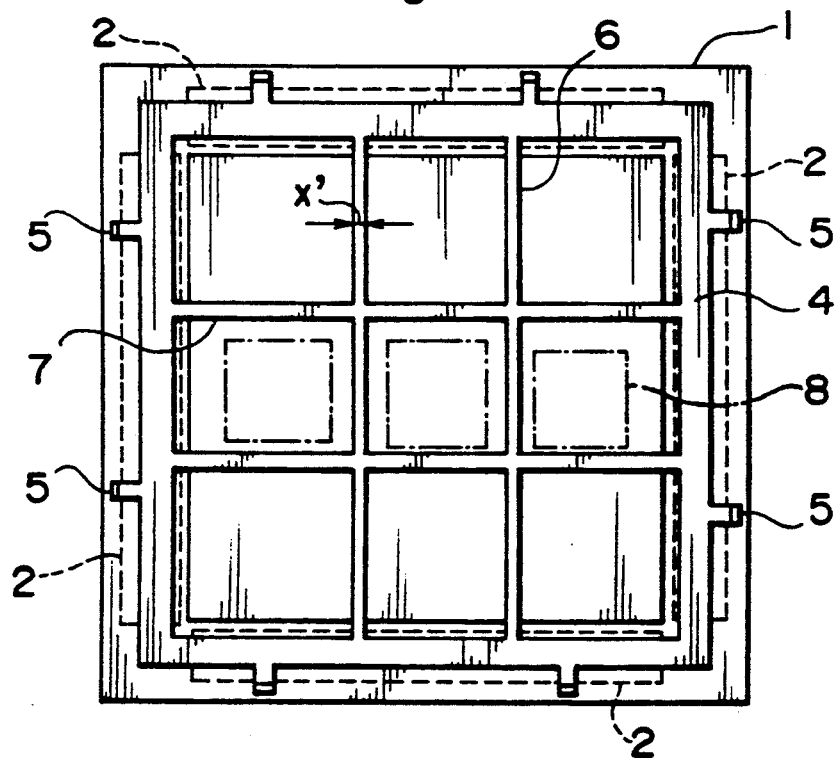
FIG. 2 is a plan view showing an example of wiring for power supply of a large-scale integrated circuit according to another embodiment of the present invention.

FIG. 1 is a plan view showing an example of wiring for a power supply in accordance with an embodiment of the present invention and FIG. 2 is a plan view showing another example of wiring therefor in accordance with an embodiment thereof. As shown in FIGS. 1 and 2, reference numeral 1 is a LSI chip, reference numeral 2 is a region in which an input-output buffer is disposed, reference numeral 3 is an inner region in which a function circuit such as logic circuit or memory circuit is disposed, reference numeral 4 for is wire for a power supply, reference numeral 5 is a bonding pad, reference numeral 6 indicates longitudinally extending wires, and reference numeral 7 indicates transversely extending wires. It is to be generally noted that, although the wire 4 and the wires 6 and 7 include wires for supply power for several types of electric voltage containing earth voltage GND, the following description is made of one type of the wire for supplying power, for brevity of explanation.

The wire 4 for supplying power is disposed along the four sides of the large-scale integrated circuit as wire for an input-output buffer gate and connected to an external power supply system of the large-scale integration through the bonding pad 5. The longitudinally extending wires 6 are so connected to the longitudinally extending sides of the wire 4 as to form a lattice shape together with the transversely extending wires 7 connected to the transversely extending sides of the wire 4 in order to supply power to the inner region 3. The inner region 3 is provided within its inside with a block region 8 for a block of function circuit groups, as indicated by dot-dash line.

Referring to FIG. 1, the wire width x of the longitudinally extending wires 6 and the lattice distance X between a longitudinally extending wires 6 and the adjacent wire 6 may be altered by using the effective number of logic circuits or memory circuits in the block region 8 for the function circuit group disposed within the inner region 3, the operative frequency of the circuits thereof, etc. as parameters, in order to supply power to the large-scale integrated chip 1 of the large-scale integrated circuit. Likewise, the wire width y of the transversely extending wire 7 and the lattice distance Y between a transversely extending wire 7 and the adjacent wire 7 may be altered by using the effective number of the logic circuits or memory circuits in the block region 8 for the function circuit group disposed within the inner region 3, the operative frequency of the circuits thereof, etc. as parameters.

For example, as shown in FIG. 1, in instances where the effective number of the circuits is large or operative frequency of the circuits is high, the wire width x of the longitudinally extending wires 6 and the wire width y of the transversely extending wires 7 are made larger or the lattice distance X between a longitudinally extending wire 6 and the adjacent wire 6 and the lattice distance Y between a transversely extending wire 7 and the adjacent wire 7 are made smaller.

On the other hand, in instances where the effective number of circuits is small or the operative frequency of the circuits is low, the wire widths x and y are altered to become smaller or the lattice distances X and Y are altered to become larger. In this case, for instance, as shown in FIG. 2, only the wire width x' of the longitudinally extending wire 6 may be so altered as to become smaller in accordance with the smaller effective number of circuits while the lattice distances X and Y are each fixed at a given distance as those of the LSI as shown in FIG. 1.

Figure 3:
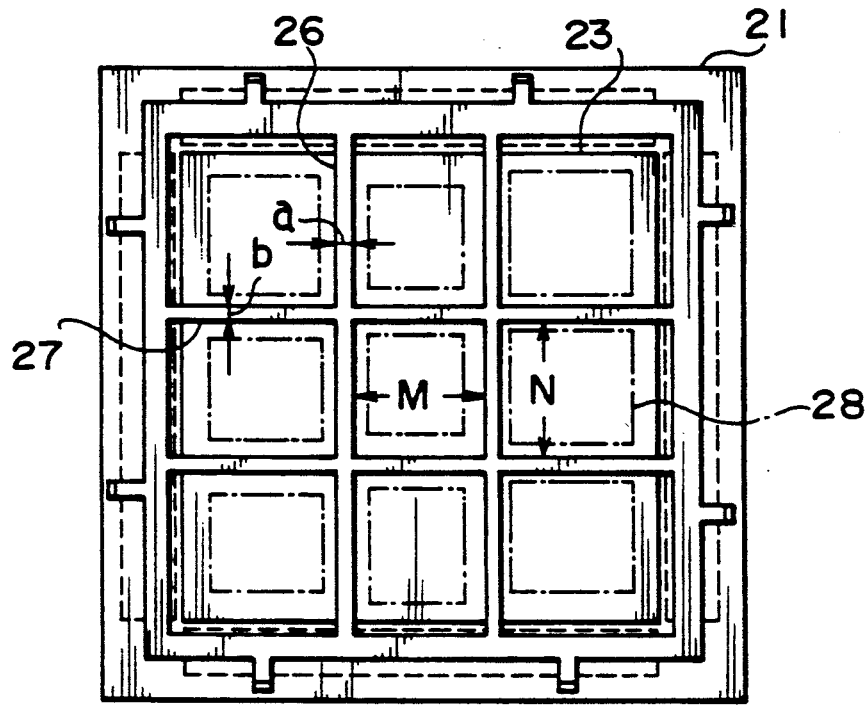
FIG. 3 is a plan view showing an example of wiring for a power supply of a large-scale integrated circuit according to a further embodiment of the present invention.
Figure 4:
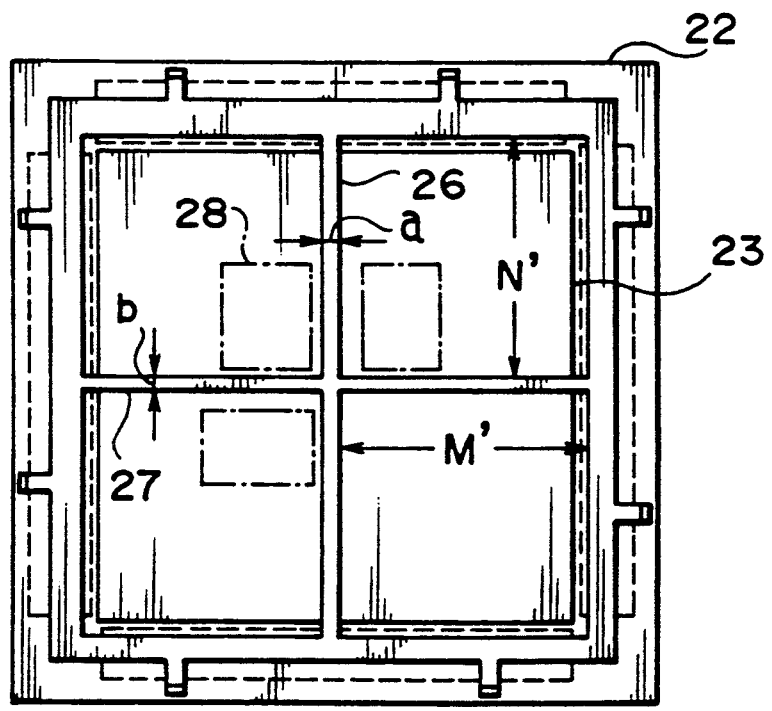
FIG. 4 is a plan view showing an example of wiring power supply of a large-scale integrated circuit according to a still further embodiment of the present invention.

FIG. 3 is a plan view showing an example of wiring for a power supply of a large-scale integrated circuit according to another embodiment of the present invention. FIG. 4 is a plan view showing an example of wiring for a power supply of a large-scale integrated circuit according to a further embodiment of the present invention.

For the large-scale integrated circuit 21 as shown in FIG. 3 and the large-scale integrated circuit 22 as shown in FIG. 4, the lattice distance M between a longitudinally extending wire 6 and the adjacent wire 6 and the lattice distance N between a transversely extending wire 7 and the adjacent wire 7 are altered while the the wire width a of the longitudinally extending wire 6 and the wire width b of the transversely extending wire 7 are fixed at a constant width. It is to be noted herein that each of the large-scale integrated circuit 21 shown in FIG. 3 and the large-scale integrated circuit 22 as shown in FIG. 4 is of the same chip size and of the same gate array family. The wire width a of a longitudinally extending wire 26 of the large-scale integrated circuit shown in FIG. 3 is equal to the wire width a of a longitudinally extending wire 26 of the large-scale integrated circuit 22 as shown in FIG. 4. Likewise, the wire width b of a transversely extending wire 27 of the large-scale integrated circuit 21 shown in FIG. 3 is equal to the wire width b of a transversely extending wire 27 of the large-scale integrated circuit 22 shown in FIG. 4. On the other hand, the lattice distance M between a longitudinally extending wire 26 and the adjacent wire 26 and the lattice distance N between a transversely extending wire 27 and the adjacent wire 27 are so set as to be altered by using the effective number of function circuits 28 disposed within an inner region 23, such as logic circuits or memory circuits, the operative frequency of the circuits, etc. as parameters. For instance, when the effective number of the circuits is large and the operative frequency of the circuits is high, the transverse lattice distance M and the longitudinal lattice distance N are made smaller, as shown in the large-scale integration 21 of FIG. 3. On the other hand, when the effective number of circuits of the function circuit 28 is small and the operative frequency of the circuits thereof is low, the transverse lattice distance M' and the longitudinal lattice distance N' are made larger as shown in the large-scale integration 22 of FIG. 4.

The transverse lattice distance M and the longitudinal lattice distance N may be defined by the following algorithmic formula:

$$M, N \propto V(a, b, L, G, F)$$

where
L = chip size;
a = wire width of longitudinally extending wire;
b = wire width of transversely extending wire;
G = effective number of logic circuits or memory circuit; and
F = frequency of logic operation (consumed electrical power).

It is thus noted that the base for designing the wiring is to process the algorithm for calculating the aforesaid formula.

Figure 5:
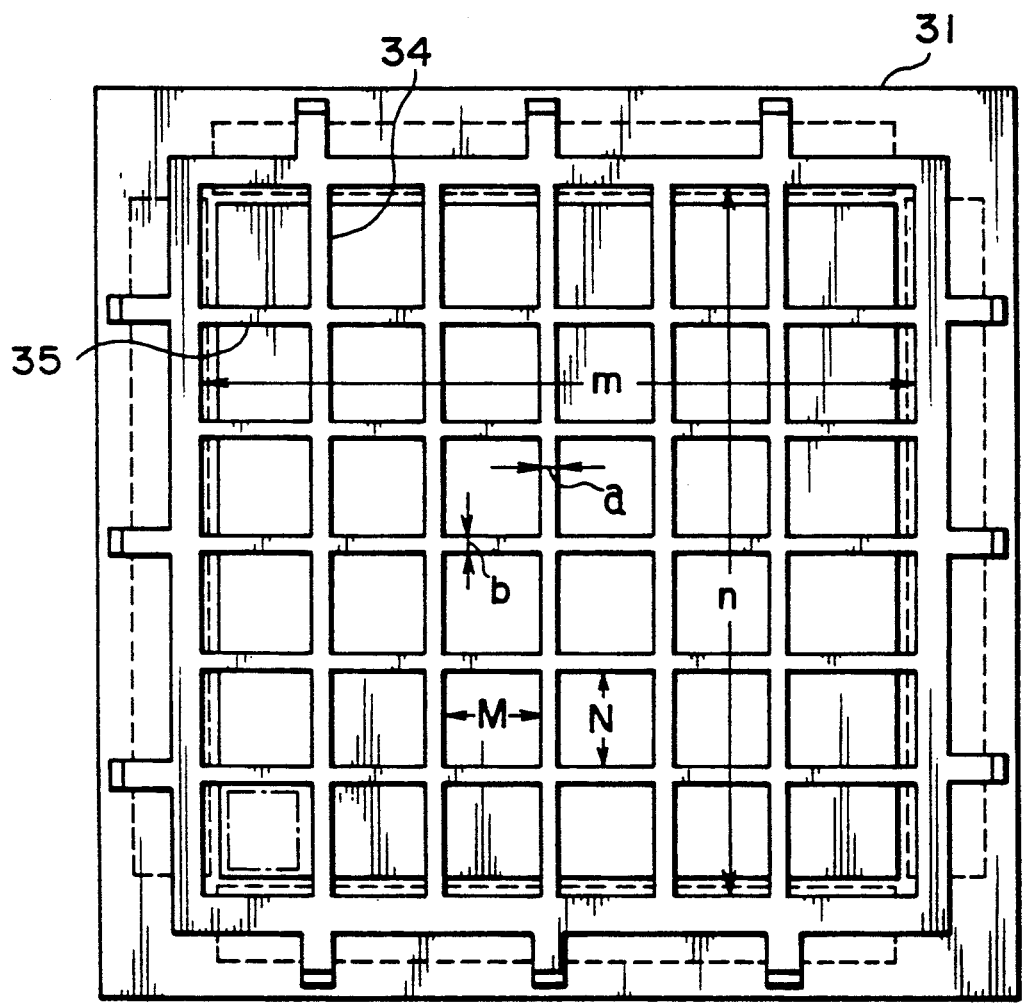
FIGS. 5 and 6 are plan views showing an example of wiring for a power supply of a large-scale integrated circuit according to yet another embodiment of the present invention.
Figure 6:
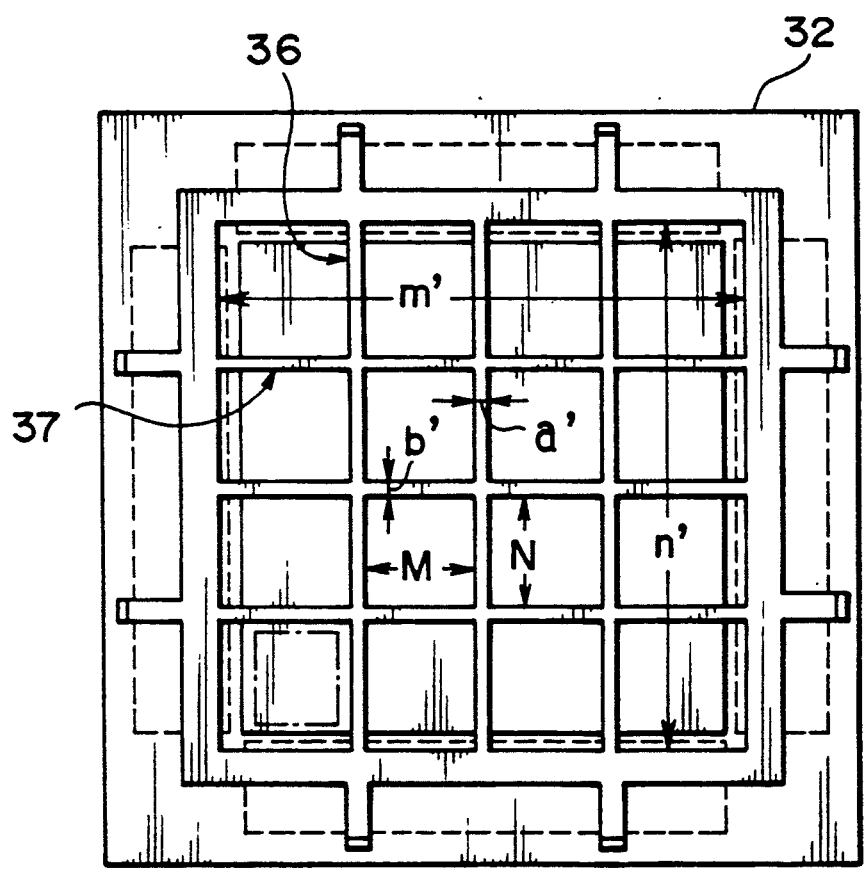

FIGS. 5 and 6 are plan views showing examples of wiring for a power supply of a large-scale integrated circuit in accordance with further embodiments of the present invention. The large-scale integrated circuit 31 shown in FIG. 5 and the large-scale integrated circuit 32 shown in FIG. 6 are described as examples in which wires having different chip sizes are disposed in a lattice shape.

It is to be noted that the large-scale integrated circuit 31 shown in FIG. 5 and the large-scale integrated circuit 32 shown in FIG. 6 belong to the same gate array family yet that the number of function circuit groups to be formed differs and their chip sizes are different. More specifically, the lattice distance M between a longitudinally extending wire 34 and the adjacent wire 34 of the large-scale integrated circuit 31 is set to be equal to the lattice distance N between a transversely extending wire 35 and the adjacent wire 35 thereof, while the width a of the longitudinally extending wires 34 and the width b of the transversely extending wires 35 are altered in accordance with the chip size, the effective number of the function circuit groups including the logic circuits or the memory circuits disposed in the inner region 3, the operative frequency of the circuits, etc. as parameters. In instances where the chip size is large or where the effective number of the circuits is large or where the operative frequency of the circuit is high, the width a of the longitudinally extending wires 34 and the width b of the transversely extending wires 35 are made larger, as indicated by the large-scale integrated circuit 31 shown in FIG. 5. On the other hand, in instances where the chip size is small or where the effective number of the circuits is small or where the operative frequency cf the circuit is low, the width a' of longitudinally extending wire 36 and the width b' of transversely extending wire 37 are made smaller, as shown by the large-scale integrated circuit 32 of FIG. 6.

The wire width of the longitudinally extending wires and the transversely extending wire may be determined, for example, as shown by the large-scale integrated circuit 31 of FIG. 5 where the chip size is larger, by computing the magnitude of consumed electrical current, Iw, per one side of a large-scale integrated chip by the following formula:

$$Iw = \frac{I \times m \times n}{2(M \times m + N \times n)}$$

where

I is an average of consumed electrical current per one block region surrounded with a pair of the longitudinally extending wires and a pair of the transversely extending wires;

m is the number of blocks of the longitudinally extending wires; and n is the number of blocks of the transversely extending wires.

The wire width of the longitudinally extending wires and the transversely, extending wire may be determined, for example, as shown by the large-scale integrated circuit 32 of FIG. 6 where the chip size is smaller, by computing the magnitude of consumed electric current, Iw', per one side of a large-scale integrated chip by the following formula:

$$Iw' = \frac{I \times m' \times n'}{2(M \times m' + N \times n')}$$

where

I is an average of consumed electrical current per one block region surrounded with a pair of the longitudinally extending wires and a pair of the transversely extending wires;

m' is the number of blocks of the longitudinally extending wire; and n' is the number of blocks of the transversely extending wire.

For instance, suppose that m=n=6 and m'=n'=4, Iw/Iw'=1.5. This means that the width of the wires for the large-scale integrated circuit 31 of FIG. 5 should be roughly one-and-a-half times larger than that of the large-scale integrated circuit 32 of FIG. 6.

Description will now be made of the method for wiring a power supply of a large-scale integration when a large-scale logic block or a large-scale memory function block (hereinafter referred to as a macroblock in generic terms) is formed in a particular portion of a LSI chip.

Figure 7:
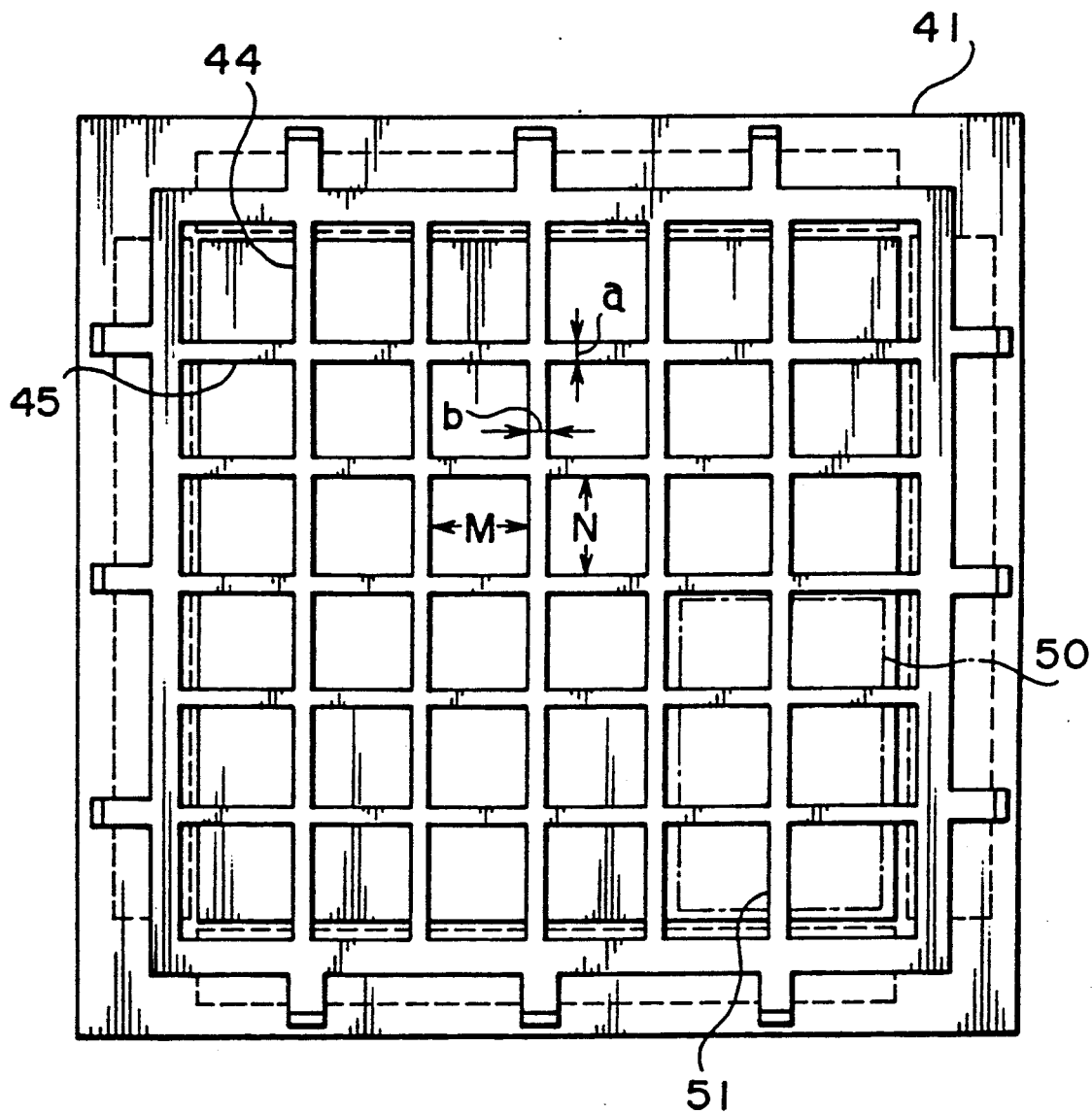
FIGS. 7 and 8 are plan view showing an example of wiring for a power supply of a large-scale integrated circuit according to a still further embodiment of the present invention.
Figure 8:
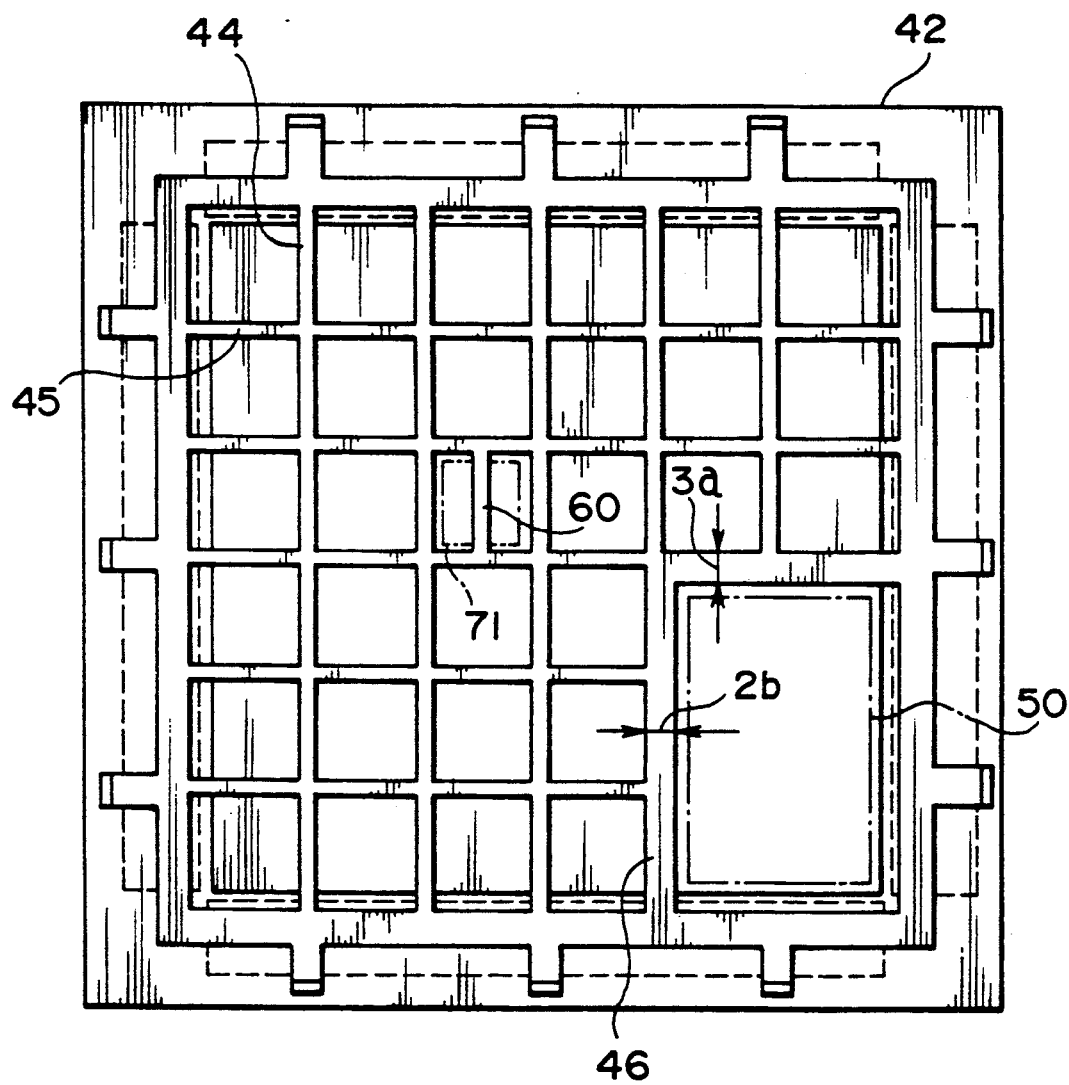

FIGS. 7 and 8 are plan views showing examples of wiring for power supply to the large-scale integration containing a macroblock.

FIGS. 7 and 8 indicate the examples of designing the wiring of the lattice-shaped wires of the large-scale integrated circuit in which the macroblock is formed at the bottom right of the large-scale integration chip. As shown in FIG. 7, the wiring for a large-scale integrated circuit 41 with no macroblock mounted is first arranged in the same manner as described hereinabove by altering the lattice distance and the wire width of the longitudinally extending wire 44 and the transversely extending wires 45. Then, the design for wiring is performed to vary the wire width, etc. for disposing the macroblock in a region 50 at the bottom right corner of the integrated circuit chip 41. The wiring for a power supply in disposing the macroblock in the region 50 is performed so as to supply power required by the macroblock. Hence, as shown in FIG. 8, the areas around the region 50 where the macroblock is disposed are so wired a power supply as to have the same area as the area of the wires 51 to be otherwise disposed in the region 50 of the large-scale integration 41 of FIG. 7, which the macroblock occupies.

More specifically, as shown in FIG. 8 where the wiring is performed for the large-scale integrated circuit 42 containing the macroblock, the wire 46 disposed around the circumference of the region 50 where the macroblock is formed is constructed in such a manner that the wire width 3a of the transversely extending wire section is broader by nearly three times than the wire width a of the other transversely extending wires 45 and the wire width 3b of the longitudinally extending wire section is broader by nearly two times than the wire width b of the other longitudinally extending wires 44.

In the large-scale integrated circuit 42 shown in FIG. 8, where the central portion is provided with a block region 71 for a function circuit, such as a source for supplying a clock, etc., which requires a particularly large quantity of electric power, the area of the block region 71 may be divided up into smaller blocks by a wire 60, thereby supplementing the power supply.

As described hereinabove, the method for wiring for a power supply according to the present invention enables effective wiring by computer processing by determining the wiring specification on the basis of the wire width a and b or the lattice distances M and N of the wires and designing the mounting of a large-scale integration chip.

More specifically, for instance, a CMOS circuit changes its consumption of electric power in accordance with the operative frequency of the logic circuit or memory circuit, while a gate array LSI consumes electrical power only for the circuit which is actually employed, among the circuit group disposed in an array form. Hence, if the wiring would be performed in an attempt to cover all types in designing a CMOS gate array LSI as an example of large-scale integration, an excessive length of wire is inevitably provided. The excessive length of wire may account for approximately from 10% to 15% of the total wires of a LSI chip in the case of a CMOS gate array LSI. although the region which the wires occupy on the LSI chip may vary with the design specification. If the region occupied by the wire becomes too large, efficiency in the disposition of each of the function circuit groups and wiring processing is lessened in processing the mounting design of the logic or memory circuit. However, in the embodiments according to the present invention, optimum wiring is designed for each type with its chip size, effective number of circuits and consumption of electrical power taken into account, so that efficiency in mounting LSIs can be remarkably improved.

The present invention has been described by way of specific examples; however, it is to be understood as a matter of course that the description of the present invention is construed to be not limitative in any respect, but illustrative, and the present invention encompasses various modifications and changes within the spirit and scope of the invention.

As described hereinabove, the method for wiring a large-scale integrated circuit according to the present invention permits optimum specification of wiring for a power supply of a large-scale integrated circuit family to be readily set so as to vary the chip size, effective number of the circuits used, operative frequency thereof, etc. with type as CMOS gate array LSI or the like, by designating a portion of the parameters for setting the wiring specification as a running parameter by computer in processing the mounting design.

As a consequence, the method of wiring according to the present invention can reduce the area occupied by wire on the LSI chip to a minimum level, thereby improving the mounting efficiency of LSIs and, at the same time, preventing reliability of the LSIs from worsening due to a lack of wire.

What is claimed is:

1. A method of wiring a power supply for a large-scale integrated circuit including a plurality of function circuits, signal wires interconnecting the function circuits, and power supply wires for providing electrical power to the function circuits, and having an integrated circuit chip size dependent upon the scale of integration of the function circuits, the power supply wires to include a plurality of longitudinally extending power supply wires extending across the integrated circuit chip and a plurality of transversely extending power supply wires extending across the integrated circuit chip to define a power supply grid surrounding lattice openings with fixed longitudinal and transverse lattice dimensions between adjacent parallel-extending wires, said method comprising:
   (a) determining a power supply wire width based on the integrated circuit chip size, the number of function circuits to be on the integrated circuit, the electrical power requirements of the function circuits, and the fixed longitudinal and transverse lattice dimensions;
   (b) determining longitudinal and transverse locations of the power supply wires on the integrated circuit chip based on the determined wire width and the fixed longitudinal and transverse dimensions of the lattice openings; and
   (c) forming longitudinally extending and transversely extending power supply wires on the integrated circuit chip at the determined locations and with the determined power supply wire width.

2. A method as claimed in claim 1, further comprising:
   (d) forming a plurality of function circuits on the integrated circuit chip, including a logic circuit, a memory circuit and an input-output buffer; and
   wherein the electrical power requirement is determined by the electrical power consumed based on the logic circuit.

3. A method as claimed in claim 1, further comprising:
   (d) when the electrical power requirement of a function circuit at one particular location of the integrated circuit chip is significantly larger than the electrical power requirement of a function circuit at another particular location of the integrated circuit chip, increasing the width of the wires in the vicinity of the function circuit at the one particular location to permit supplemental power supply thereto.

4. A method as claimed in claim 1, wherein when the plurality of function circuits includes a large-scale function block, step (b) includes determining a wire width around a particular region of the integrated circuit chip in which the large-scale function block is to be disposed which results in a wire area equal to the wire area of the power supply wire that would occupy the particular region for usual function circuits.

5. A method of wiring a power supply for a large-scale integrated circuit including a plurality of function circuits, signal wires interconnecting the function circuits, and power supply wires for providing electrical power to the function circuits, and having an integrated circuit chip size dependent upon the scale of integration of the function circuits, the power supply wires including a plurality of longitudinally extending power supply wires of a known width extending across the integrated circuit chip and a plurality of transversely extending power supply wires of the known width extending across the integrated circuit chip to define a power supply grid surrounding lattice openings, said method comprising:
   (a) determining longitudinal and transverse dimensions of the lattice openings based on the integrated circuit chip size, the number of function circuits to be on the integrated circuit, the electrical power requirements of the function circuits and the known power supply wire width;
   (b) determining longitudinal and transverse locations for the power supply wires on the integrated circuit chip based on the known wire width and the determined longitudinal and transverse dimensions of the lattice openings; and
   (c) forming longitudinally extending and transversely extending power supply wires on the integrated circuit chip at the determined locations and with the known power supply wire width.

6. A method as claimed in claim 5, further comprising:
   (d) forming a plurality of function circuits on the integrated circuit chip, including a logic circuit, a memory circuit and an input-output buffer; and
   wherein the electrical power requirement is determined by the electrical power consumed based on the logic circuit.

7. A method as claimed in claim 5, further comprising:
   (d) when the electrical power requirement of a function circuit at one particular location of the integrated circuit chip is significantly larger than the electrical power requirement of a function circuit at another particular location of the integrated circuit chip, increasing the width of the wires in the vicinity of the function circuit at the one particular location to permit supplemental power supply thereto.

8. A method as claimed in claim 5, wherein when the plurality of function circuits includes a large-scale function block, step (b) includes determining a wire width around a particular region of the integrated circuit chip in which the large-scale function block is to be disposed which results in a wire area equal to the wire area of the power supply wire that would occupy the particular region for usual function circuits.

* * * * *